(12) United States Patent
Cai et al.

(10) Patent No.: US 10,651,347 B2
(45) Date of Patent: May 12, 2020

(54) ENCAPSULATING PACKAGE FOR WHITE LIGHT LED

(71) Applicants: Dengke Cai, Willoughby, OH (US); Tiejun Wang, Lin'an (CN)

(72) Inventors: Dengke Cai, Willoughby, OH (US); Tiejun Wang, Lin'an (CN)

(*) Notice: Subject to any disclaimer, the term of this patent is extended or adjusted under 35 U.S.C. 154(b) by 0 days.

(21) Appl. No.: 16/048,507

(22) Filed: Jul. 30, 2018

(65) Prior Publication Data
US 2020/0035871 A1 Jan. 30, 2020

(51) Int. Cl.
*H01L 33/50* (2010.01)
*H01L 33/52* (2010.01)

(52) U.S. Cl.
CPC ........... *H01L 33/502* (2013.01); *H01L 33/52* (2013.01); *H01L 2933/0041* (2013.01)

(58) Field of Classification Search
CPC ............... H01L 33/502; H01L 33/52; H01L 2933/0041
USPC ............................................................ 257/98
See application file for complete search history.

(56) References Cited

U.S. PATENT DOCUMENTS

| | | | |
|---|---|---|---|
| 9,243,777 B2 | 1/2016 | Donofrio et al. | |
| 9,657,922 B2 | 5/2017 | Negley et al. | |
| 2008/0188611 A1* | 8/2008 | Lynch | C03C 11/002 524/548 |
| 2010/0096998 A1* | 4/2010 | Beers | C09K 11/7734 315/182 |
| 2015/0252953 A1* | 9/2015 | Progl | F21K 9/23 362/84 |
| 2015/0292059 A1* | 10/2015 | Yamamoto | B09B 3/0016 423/21.1 |
| 2016/0097496 A1* | 4/2016 | Allen | F21V 3/12 257/40 |
| 2016/0097497 A1* | 4/2016 | Benner | F21V 3/12 313/503 |
| 2016/0290573 A1* | 10/2016 | Allen | F21K 9/233 |
| 2017/0261181 A1 | 9/2017 | Cai et al. | |
| 2018/0156420 A1 | 6/2018 | Dudik et al. | |

FOREIGN PATENT DOCUMENTS

| | | |
|---|---|---|
| AU | 2017251855 A1 | 11/2017 |
| CN | 106398157 A | 2/2017 |
| WO | 2016057604 A1 | 4/2016 |

OTHER PUBLICATIONS

Anant A. Setlur, Phosphors for LED-based Solid-State Lighting, The Electrochemical Society Interface, Winter 2009.

* cited by examiner

*Primary Examiner* — Dzung Tran
(74) *Attorney, Agent, or Firm* — Daniel M. Cohn; Howard M. Cohn

(57) ABSTRACT

A light-transmissive encapsulating package is configured to encapsulate an LED die. The encapsulating package includes a light-transmissive bulk encapsulating material. One or more phosphors are blended into the bulk encapsulating material for white light emission. A notch-filtering filter material is blended into the bulk encapsulating material and includes Nd(III) bonded to a non-fluoride halide and is present at a concentration in the range 0.5-3.0% by volume of the bulk encapsulating material.

19 Claims, 13 Drawing Sheets

2835  3014  3528  3535

EMC3535  5730  COB LB019

US 10,651,347 B2

ENCAPSULATING PACKAGE FOR WHITE LIGHT LED

FIELD OF THE INVENTION

This invention relates generally to the field of LEDs, and more particularly to a light-transmissive encapsulating material configured to encapsulate an LED die.

BACKGROUND

A typical light emitting diode (LED) includes an LED die mounted on a cathode. A filament extends from an anode to a top of the LED die. The LED die is encapsulated in a protective light-transmissive (i.e., transparent or translucent) package. In a typical white light emitting LED, the die emits a narrow band in the blue spectral region. The light-transmissive package includes a transparent bulk encapsulating material. A yellow-emitting phosphor (that emits in the yellow and green region) and a red-emitting phosphor are blended into the bulk encapsulating material. In operation, the die is electrically activated to emit blue light, and the phosphors respectively convert a portion of the blue light to a band in the yellow spectral region and band in the red spectral region. The three bands (blue, yellow/green, red) exit the encapsulating package and appear to an observer as white light. A notch filter is blended into bulk encapsulating material to absorb a narrow band in the yellow spectral region.

SUMMARY

An example light-transmissive encapsulating package is configured to encapsulate an LED die. The encapsulating device includes a light-transmissive bulk encapsulating material. One or more phosphors are blended into the bulk encapsulating material for white light emission. A notch-filtering filter material is blended into the bulk encapsulating material and includes Nd(III) bonded to a non-fluoride halide.

In different embodiments, the one or more phosphors includes a yellow-emitting phosphor and a red-emitting phosphor. The halide might be chlorine. The filter material might include an oxide group. The filter material might be $NdO_xCl_y$, (where x and y are positive real numbers). Which would be NdOCl in an example where x=y=1. The filter material might be present as a hydrate. The filter material might be $NdO_xCl_y \cdot zH_2O$ (where z is a positive real number). The bulk encapsulating material might be silicone. The yellow-emitting phosphor might comprise Ce-doped YAG, and the red-emitting phosphor might comprise Eu-doped $CaAlSiN_3$. The filter material might have an absorption peak at a wavelength in the range 580-600 nm. The filter material might be present, in the bulk encapsulating material, at a concentration that yields a color rendering index (CRI) value and a lumens-per-watt (LPW) value that are correlated to each other based on a formula.

An example method is for determining a concentration of a notch-filtering filter material to be blended in a light-transmissive package for encapsulating an LED die. The encapsulating package includes a light-transmissive bulk encapsulating material and one or more phosphors blended into the bulk encapsulating material for white light emission. The method includes determining an initial color rendering index (CRI) value for the package when the package includes an initial concentration of the filter material blended into the bulk encapsulating material. The method further includes determining an initial lumens-per-watt (LPW) value for the package when package includes the initial concentration of the filter material blended into the bulk encapsulating material. The method further includes determining a concentration adjustment, from the initial concentration of the filter material, that will yield an adjusted CRI value exceeding 80 and an LPW value exceeding 80.

In different embodiments of the method, the concentration adjustment yields an adjusted concentration from which further increase of the filter concentration will increase the CRI value by a first percentage and decrease the LPW value by a second percentage that is less than the first percentage. The concentration adjustment is calculated based on a formula that correlates CRI with LPW. The concentration adjustment is determined so as to satisfy a formula that correlates change-in-CRI to change-in-LPW. The initial concentration of the filter material might be substantially zero. The filter material might include Nd(III) bonded to a halide. The one or more phosphors might include a yellow-emitting phosphor comprising Ce-doped YAG and a red-emitting phosphor comprising Eu-doped $CaAlSiN_3$, and the bulk encapsulating material might comprise silicone.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
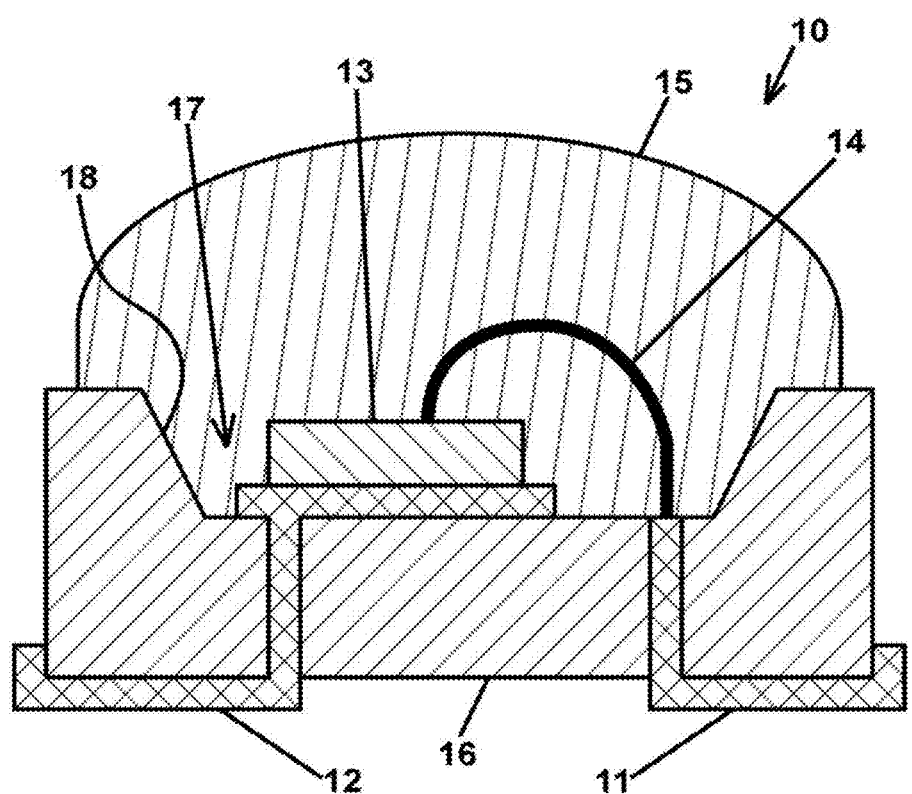
FIG. 1 is a sectional view of a surface-mount LED module, according to an embodiment of the disclosed invention.

FIG. 1 shows an example light emitting diode (LED) module 10. The module 10 is a white LED module in that it is configured to emit white light. The module 10 includes an anode 11 and a cathode 12. An LED die 13 is mounted on the cathode 12. A filament 14 (bond wire) extends from a top of the anode 11 to a top of the die 13. The die 13 and the filament 14 are encapsulated by a light-transmissive encapsulating package 15 (where "light-transmissive" herein means transparent or translucent). The encapsulating package 15 is formed of a light-transmissive bulk encapsulating material. A yellow/green-emitting phosphor (herein called yellow phosphor), a red-emitting phosphor (herein called red phosphor), and a filter material are mixed with (blended into) the bulk encapsulating material.

In operation, electrical current, flowing from the anode 11 through the filament 14 and die 13 to the cathode 12, activates the die 13 to emit a spectral band that includes blue light. The yellow phosphor converts a portion of the blue light to a spectral band in the yellow/green region. The red phosphor converts a portion of the blue light to a spectral band in the red region. The filter material in the package 15 serves as a notch filter, by absorbing a narrow band of light within the yellow spectral region. The resulting three bands (blue, yellow/green, red) exit the encapsulating package and appear to an observer as white light enhanced color quality.

The LED module 10 includes a substrate 16 of insulating material. The substrate 16 secures the anode 11 and the cathode 12 in place. The substrate 16 includes a cavity 17, in which the die 13 is located. The cavity 17 is bounded by a white reflective surface 18 (white reflective frame) of the substrate 16.

The die 13 is formed of a semiconducting material that is doped with impurities to create a p-n junction. In this example, the die is formed of InGaN.

Figure 2:
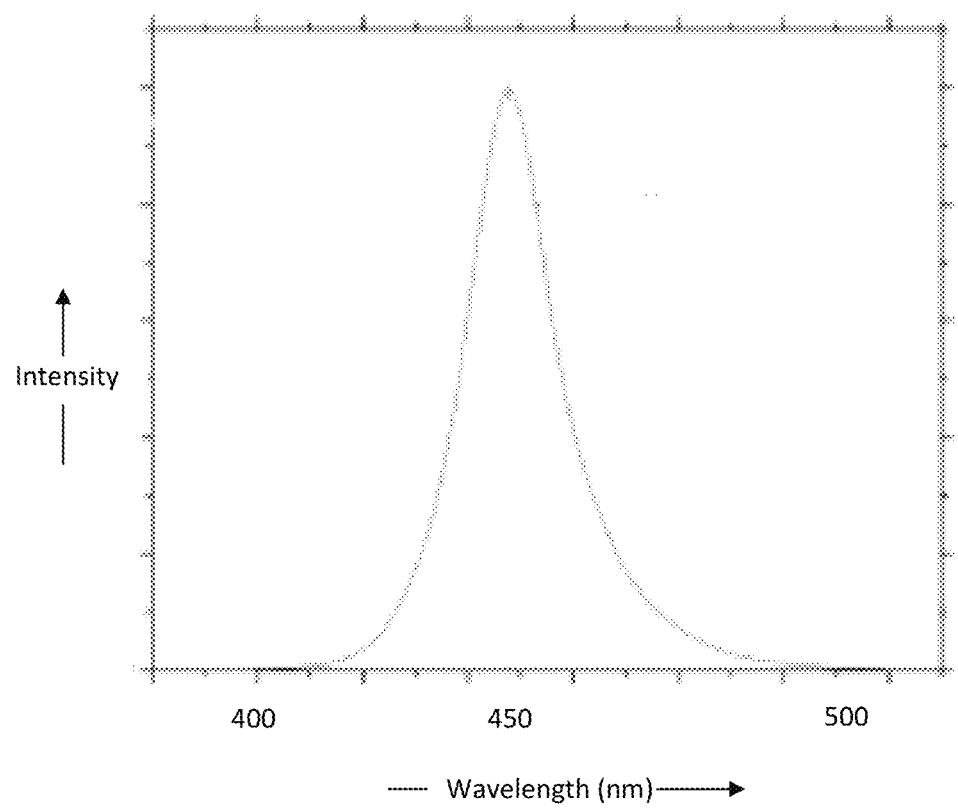
FIG. 2 shows an example emission spectrum of a die of the LED module, according to an embodiment of the disclosed invention.

FIG. 2 shows an example emission spectrum of the die, with a peak at 448 nm.

The encapsulating package 15 is light-transmissive (i.e., transparent or translucent) and rigid and protects the die 13. The encapsulating package 15 includes a light-transmissive bulk material. Examples of the bulk material are silicone, epoxy, acrylic, and their hybrids, etc.

The yellow phosphor, the red phosphor and a filter material are mixed with (blended into) the bulk encapsulating material. Each of the phosphors might be present in the encapsulating material in the range 0.5% to 5% by volume of the encapsulating package 15, based on different parameters, such as for example color temperature and packaging form factors.

The yellow phosphor in this example is cerium-doped yttrium aluminum garnet, Ce:YAG. The Ce:YAG might include Lu. Another yellow phosphor is $Tb_{3-x}RE_xO_{12}$:Ce (TAG) were RE is Y, Gd, La or Lu. Another yellow phosphor is $Sr_{2-x}Ba_xCa_ySiO_4$:Eu. Yet another is $LuAG:Lu_3Al_5O_{12}$:$Ce^{3+}$. Yet another yellow phosphor is $CaGa_2S_4$:$Eu^{2+}$.

An example of the red phosphor is Eu-doped calcium aluminum silicon nitride, $CaAlSiN_3$:Eu. Another red phosphor is $Ca^{2+}\alpha$-SiAlON and $M_2Si_5N_8$ where M is $Ca^{2+}$, $Sr^{2+}$ or $Ba^{2+}$. Another red phosphor is $MSi_2O_2N_2$:$Eu^{2+}$ where M is $Ca^{2+}$, $Sr^{2+}$, or $Ba^{2+}$. Another red phosphor is $Sr_xCa_{1-x}S$:EuY were Y is halide. Another is $CaAlSiN_3$:Eu. Yet another red phosphor is $Sr_{2-y}CaySiO_4$:Eu.

Figure 3:
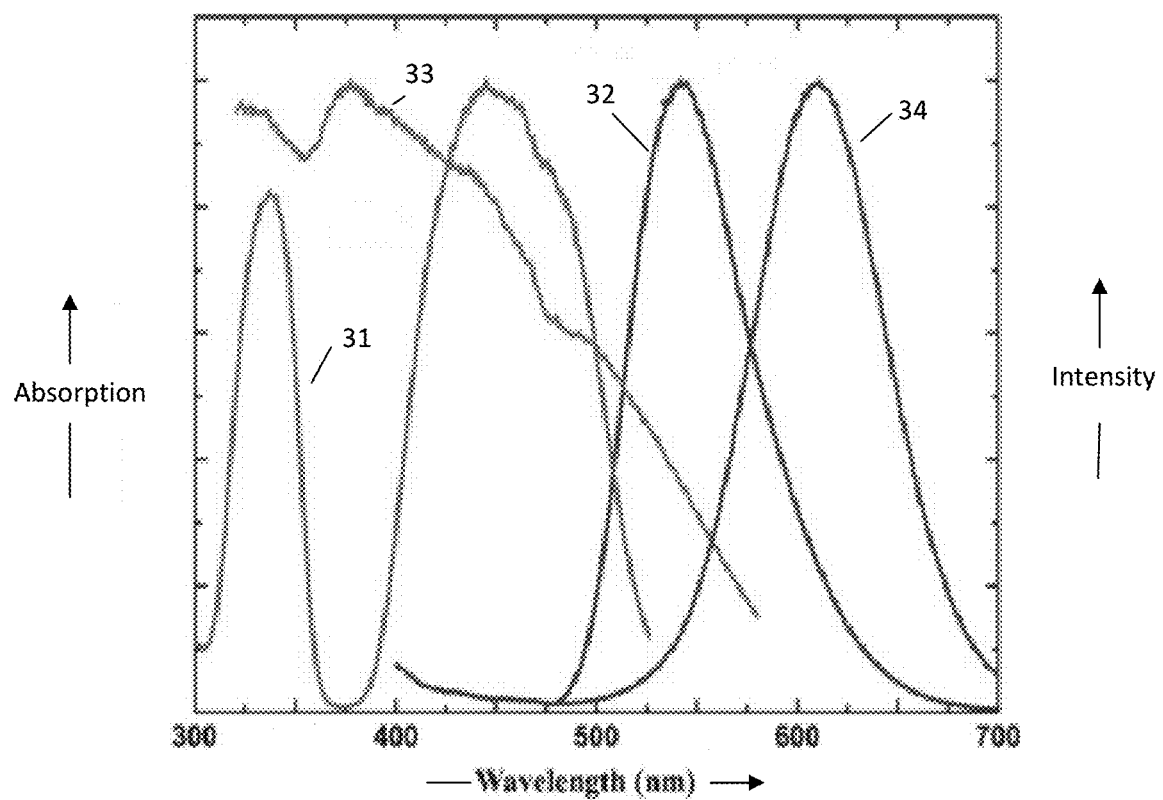
FIG. 3 shows example absorption (excitation) spectra and example emission spectra of two phosphors that are blended into an encapsulating package of LED module, according to an embodiment of the disclosed invention.

FIG. 3 shows an example absorption (excitation) spectrum 31 and an example emission (intensity) spectrum 32 of the Ce:YAG yellow phosphor, and also an example absorption (excitation) spectrum 33 and an example emission spectrum 34 of the $CaAlSiN_3$:Eu red phosphor.

In this example, the filter material is neodymium in a third oxidation state, abbreviated $Nd^{3+}$ and Nd(III). The Nd might be bonded to a halide (abbreviated X in formulas), which might be a non-fluoride halide, for example Cl. An example of the Nd halide is $NdX_3$, such as $NdCl_3$. The Nd might also be bonded to an oxide (O) group. For example $NdCl_xO_y$, in which x and y are positive real numbers. $NdCl_xO_y$ is NdClO in an example where x=y=1. The Nd molecule might be hydrated. Examples are $NdCl_xO_y \cdot zH_2O$ (where z is a positive real number). The filter material might be present in the form of particles of size (greatest dimension) in the range 0.5 um to 100 um, for example size D50.

Figure 4:
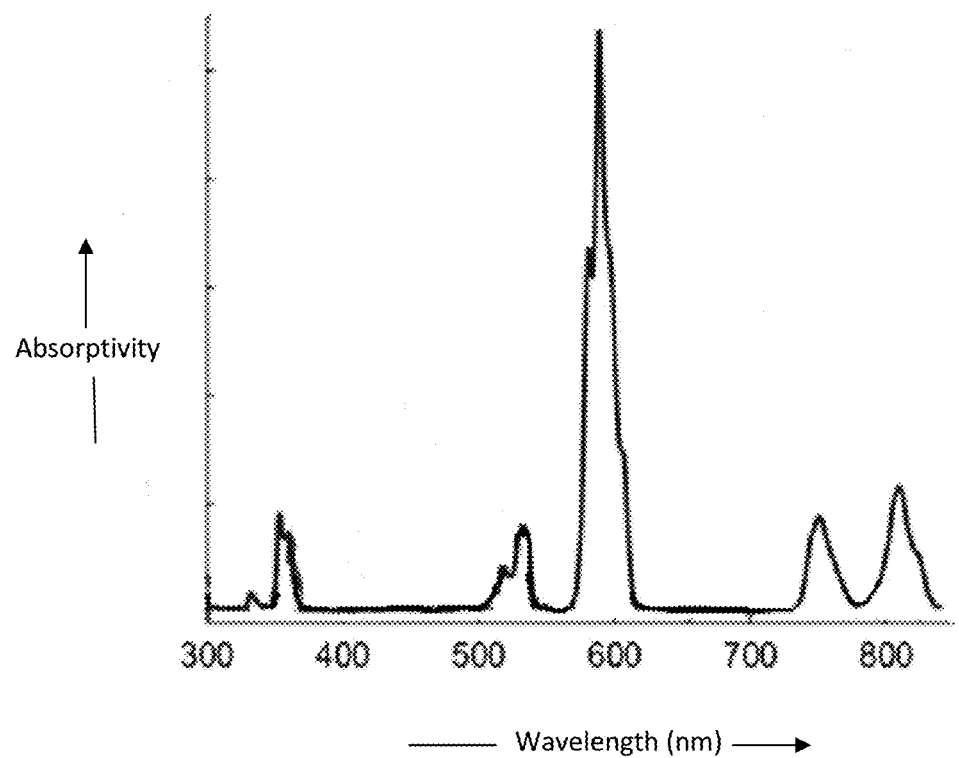
FIG. 4 shows an example absorptivity spectrum of a filter material that is blended into the encapsulating package of the LED module. according to an embodiment of the disclosed invention.

FIG. 4 shows an example absorptivity spectrum of the $NdCl_3$ filter material. The main peak has a notch-filtering absorption peak in the range 560-600 nm, and in this example in the range 580-600 nm.

The phosphors and the filter material might exist in the form of particles, which might have sizes (largest dimensions) in the range 1 um to 100 um, and which are dispersed throughout the bulk encapsulating material.

Since the particles (of the phosphors and filter material) have refractive indexes (RIs) that differ from the RI of the bulk encapsulating material, light propagating through the encapsulating package is reflected (such as by mie scattering) by each particle it passes through. The percentage of light reflected from a given particle is a positive function of the difference in RI between the particles and the bulk material. The number of reflections a ray of light undergoes before exiting the packages is a positive function of the concentration (number per volume) of the particles within the bulk material and the difference in RI between the particles and the bulk material. The occurrence of multiple reflections (light scattering) causes the light ray to take a path through the package 15 that is both contorted and longer than if the reflections did not occur. The greater the extent of light scattering, and thus the longer the light path within the package, the greater the number of times the light will impinge the particles (of phosphors and filter material) before exiting the package, and thus the greater the amount of phosphorescence and absorption the particles (of phosphors and filter material) will yield. The light scattering described above might cause the package to appear translucent as opposed to transparent. Also, since the bulk material is not 100% transparent (i.e., it is slightly absorptive) and the package frame is not 100% reflective, the greater the RI difference, and thus the longer the light path within the package, the greater the light absorption by the package, and thus the lower the output efficiency (lumens per watt) for that package.

Based on mie scattering theory, a larger RI difference between filter-containing inorganic filler and the encapsulation material helps improve particle scattering efficiency or material utilization efficiency within the LED package and thus decreases the amount of filter material needed in the package, and therefore reduces material cost. Particle size is another factor affecting scattering efficiency. Smaller particle size helps lower the probability of non-absorbed photons (for those photons which are not absorbed by the filter material, but refracted) trapped inside the LED package and results in greater absorption from LED package materials such as white reflective frame.

Refractive index (RI) of silicones used for LED encapsulation might be 1.42 for methyl type silicone and 1.46-1.55 for phenyl type silicone. The concentration of phenyl used to replace methyl in 1.42 silicone determines the RI. RI of $NdCl_3$ is 1.55. RI of $Nd_2O_3$ is 1.8. RI of $NdCl_xO_y$ might be in the range 1.55-1.8. The RI of 1.55 of $NdCl_3$ is close to that of silicone so the scattering coefficient is low, and therefore requires higher concentration of $NdCl_3$ filter material in the LED package to achieve the needed filter absorption to achieve a given CRI increase compared to $NdCl_xO_y$.

Figure 5:
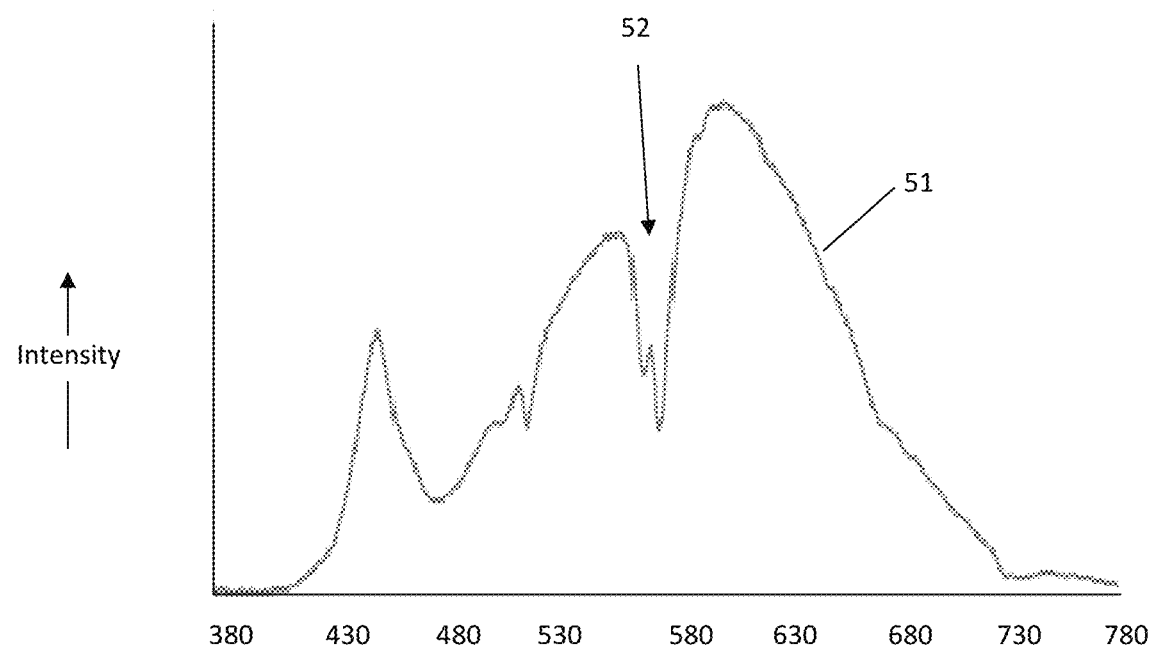
FIG. 5 shows an example output spectrum of light exiting the encapsulating package.

FIG. 5 shows an example output spectrum 51 of light exiting the encapsulating package (3000 K CRI 90 LED spectrum). This output spectrum comprises contributions from the LED die and the phosphors, as attenuated by the filter material. The spectrum includes a notch 52 caused by absorption of the filter material. Accordingly, the filter material serves as a notch filter. The absorption, by the filter material, at the narrow spectral region of this absorption peak improves (increases) the color rendering index (CRI) of light exiting the package.

The filter material also exhibits a less-significant absorption at other locations in the spectrum, which reduces energy efficiency in terms of lumens-per-watt (LPW), without significantly affecting CRI. Accordingly, for a given selection of package components (bulk encapsulating material, yellow phosphor, red phosphor, and filter materiel) and for a given concentration of each of the phosphors within the bulk material, CRI is a position function of (positively related to) the filter material's concentration and LPW is an inverse function of (inversely related to) the filter material's concentration.

Figure 6:
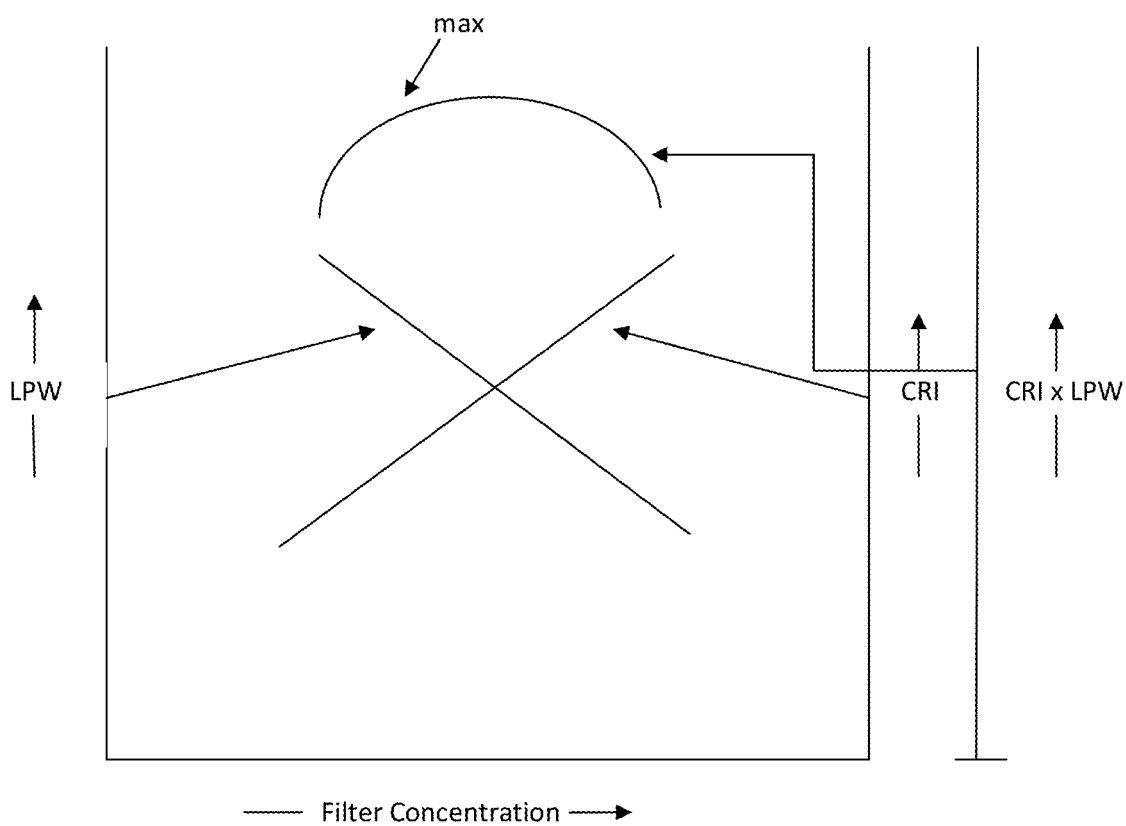
FIG. 6 is an example graph of CRI and LPW vs concentration of the filter material, according to an embodiment of the disclosed invention.

FIG. 6 illustrates the aforementioned relationship between CRI and LPW vs filter concentration. As shown, CRI increases and LPW decreases with increasing concentration of the filter material. An increase of CRI is at the expense of LPW, and vice versa. The filter material might be present at a concentration in the range 0.5% to 3% by volume of the encapsulating package 15. This concentration range provides an optimum balance of CRI and LPW. A concentration below this range might provide insufficient CRI for best color rendering. A concentration above this range might provide insufficient LPW for best efficiency.

An engineer that is designing an LED might start off with a given selection of package materials (bulk material, phosphors, and filter materiel) and with a given concentration of each of the phosphors, and then use a method to determine the optimum concentration for the filter material. The method of determining the filter concentration, to be blended into the bulk encapsulating material, is configured to result in a filter concentration that yields a CRI value and LPW value that are correlated to each other based on a formula; i.e., that satisfies a formula that correlates CRI with LPW.

For example, the formula might specify, for any filter concentration c, a multiplication product p:

$$p(c) = CRI(c) \cdot LPW(c) \qquad \text{(equation 1)}$$

where CPI and LPW are functions of filter concentration c, and the bullet in the equation is a multiplication sign. An example of this multiplication product p=CRI·LPW is illustrated in FIG. 6. In this method, the engineer would determine the desired filter concentration as the concentration c that maximizes p in equation 1, which is where p reaches a maximum (labeled "max" in FIG. 6).

The filter concentration that maximizes the multiplication product p might be the same filter concentration that causes the differential of p to equal zero; i.e., $$p'(c) = 0 \qquad \text{(equation 2)}$$

where p' is the differential of function p. Based on the chain rule of calculus, equation 2 is equivalent to:

$$p'(c) = CRI(c) \cdot LPW'(c) + LPW(c) \cdot CRI'(c) = 0 \qquad \text{(equation 3)}$$

where the bullets are multiplication signs, and p', CRI' and LPW' are the differentials of functions p, CRI and LPW with respect to concentration c. The differentials represent incremental changes in p, CRI and LPW with respective to incremental change in c. Equation 3 thus correlates change-in-CRI to change-in-LPW with respect to change-in-concentration. In this method, the engineer would determine the desired filter concentration as the concentration c that satisfies equation 3.

Additionally, or alternatively, the engineer might first determine both an initial CRI value and an initial LPW value for a package that includes an initial concentration of the filter material blended into the bulk encapsulating material. The engineer might then determine a concentration adjustment, from the initial filter concentration, that will satisfy equation 3. Or the engineer might then determine a concentration adjustment, from the initial filter concentration, that that will yield an adjusted CRI value exceeding a CRI threshold and an LPW value exceeding an LPW threshold. The CRI threshold might be 80. The LPW might be 80. Adding the determined concentration adjustment value to the initial filter concentration would yield a final filter concentration to be blended into the bulk material. The initial filter concentration (mentioned above) might be substantially zero (e.g., zero), such that the initial CRI value and the initial LPW value are determined starting off with a package containing no filter material.

In another method, the concentration adjustment might be determined such that further increase of the filter concentration will both (1) increase the CRI value by a first percentage and (2) decrease the LPW value by a second percentage, where the second percentage is less than the first percentage.

Figure 7:
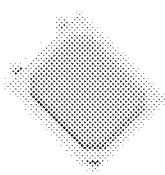
FIG. 7 shows different LED modules (LED configurations) for which the elements and procedures, that are described herein, might be applied.
Figure 7:
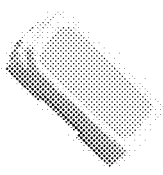
Figure 7:
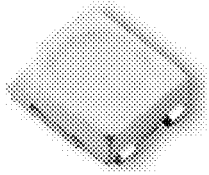
Figure 7:
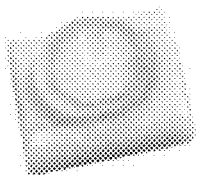
Figure 7:
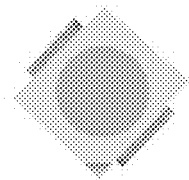
Figure 7:
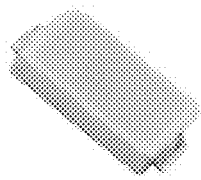
Figure 7:
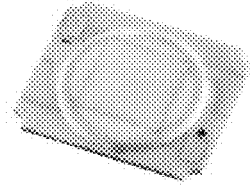

FIG. 7 shows different LEDs (LED configurations) for which the elements and procedures, that are described herein, might be applied.

Figure 8:
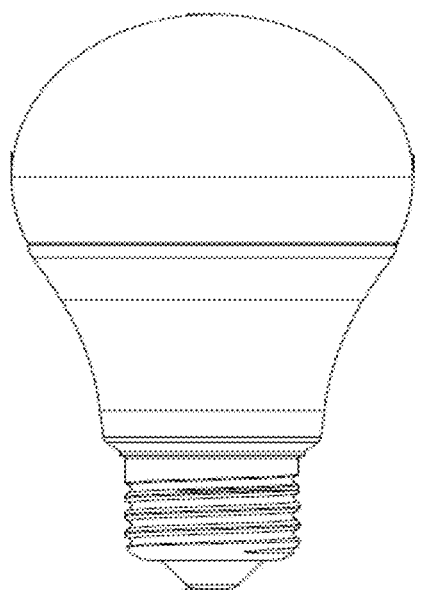
FIGS. 8-13 show different LED lamps (lamp configurations) for which the elements and procedures, that are described herein, might be applied.
Figure 9:
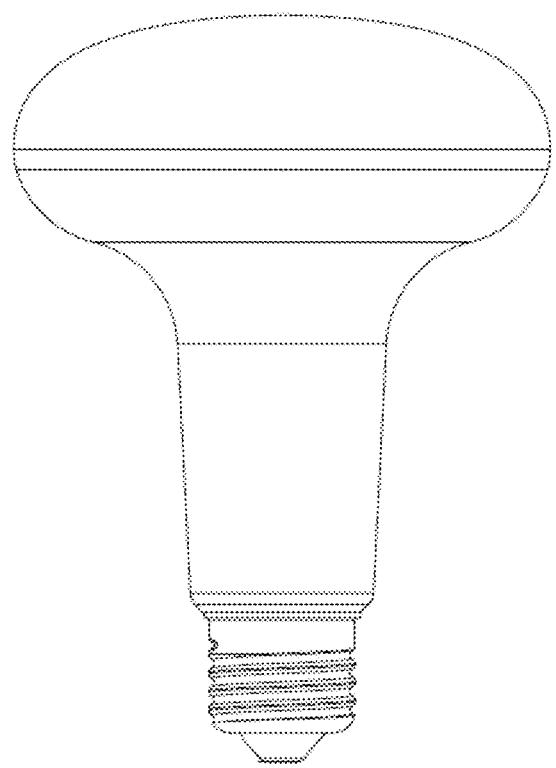
Figure 10:
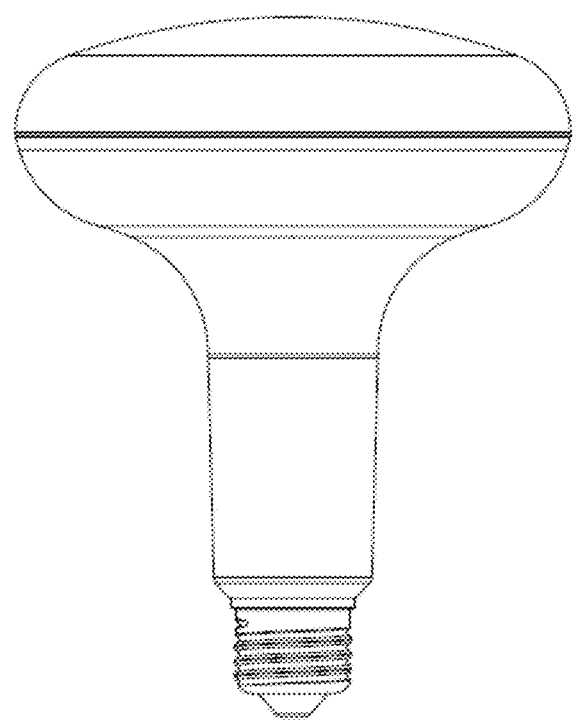
Figure 11:
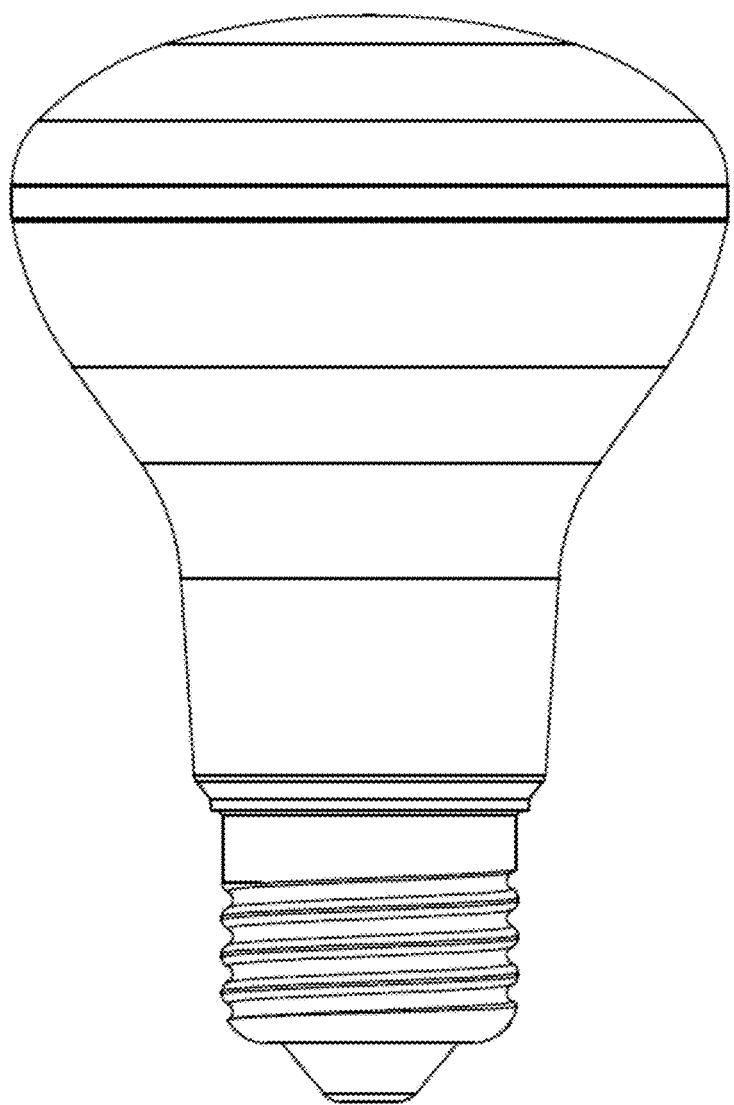
Figure 12:
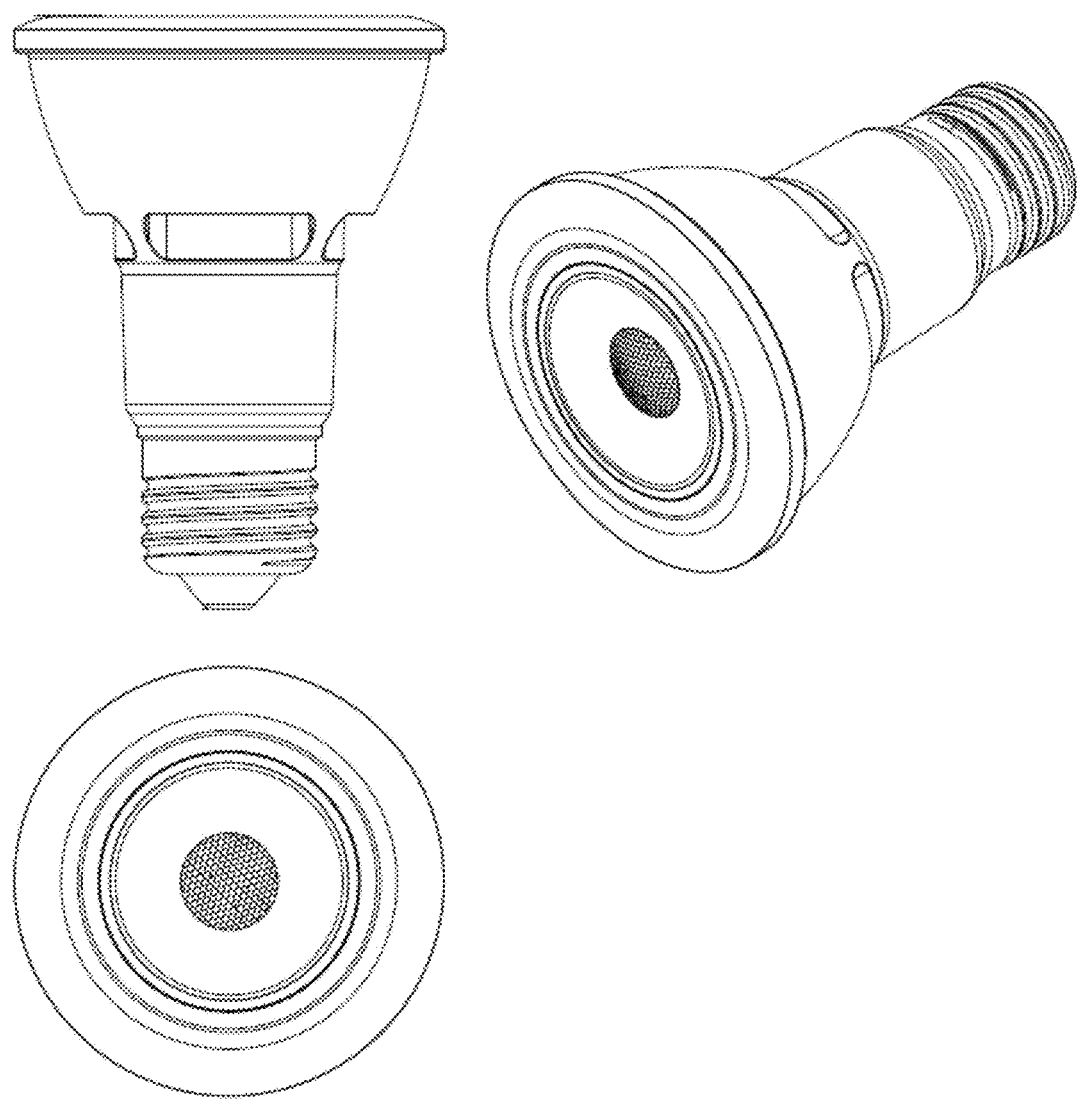
Figure 13:
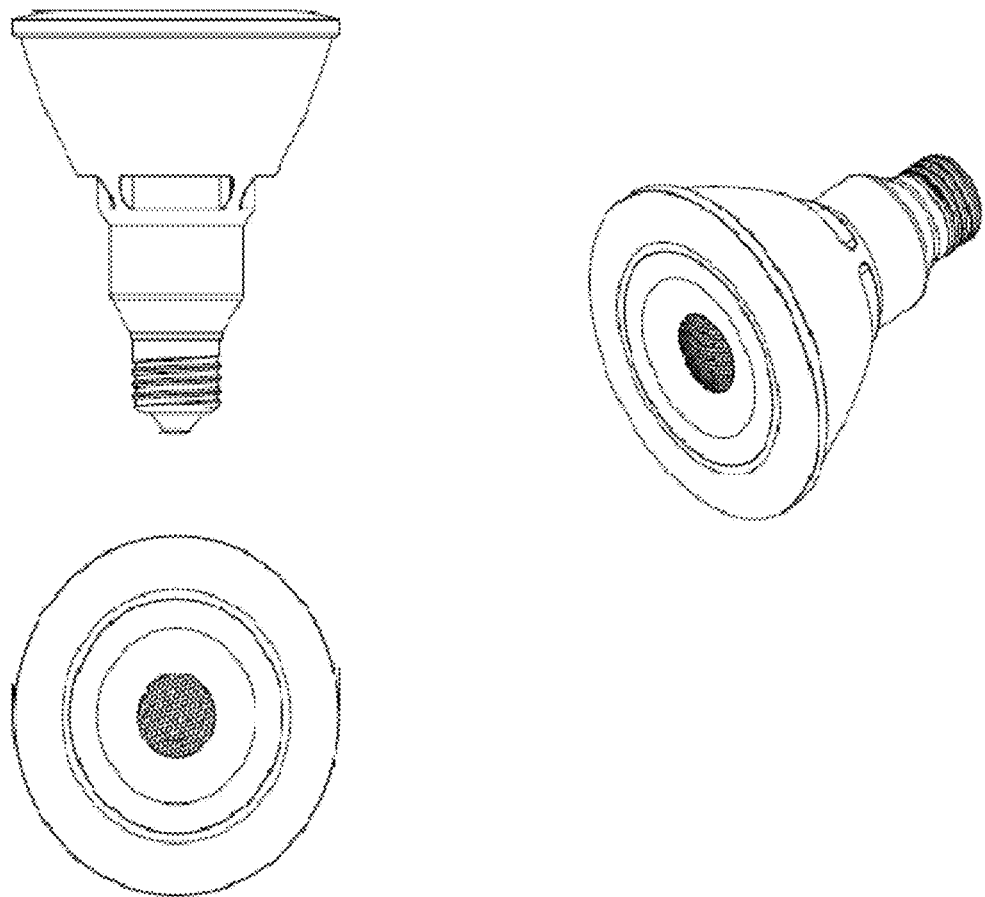

FIGS. 8-13 show different LED lamps (lamp configurations) for which the elements and procedures, that are described herein, might be applied. FIG. 8 shows an A line lamp configuration. FIG. 9 shows a BR30 lamp configuration. FIG. 10 shows a BR40-G2 configuration. FIG. 11 shows a nonstandard lamp configuration. FIG. 12 shows a PAR20 lamp configuration. FIG. 13 shows a PAR30 lamp configuration.

The components and procedures described above provide examples of elements recited in the claims. They also provide examples of how a person of ordinary skill in the art can make and use the claimed invention. They are described here to provide enablement and best mode without imposing limitations that are not recited in the claims. In some instances in the above description, a term is followed by a substantially equivalent term or alternative term enclosed in parentheses.

We claim:

1. A light-transmissive encapsulating package configured to encapsulate an LED die, the encapsulating package comprising:
   a light-transmissive bulk encapsulating material;
   one or more phosphors blended into the bulk encapsulating material for white light emission; and
   a notch-filtering filter material that
      is blended into the bulk encapsulating material,
      comprises $NdO_xCl_y \cdot zH_2O$, in which x and y and z are non-zero positive real numbers and the Nd is in a third oxidation state, and
      is present at a concentration in the range 0.5-3.0% by volume of the bulk encapsulating material.

2. The encapsulating package of claim 1, wherein the one or more phosphors include a yellow-emitting phosphor and a red-emitting phosphor.

3. The encapsulating package of claim 2, wherein the bulk encapsulating material is silicone.

4. The encapsulating package of claim 2, wherein:
the yellow-emitting phosphor comprises Ce-doped YAG, and
the red-emitting phosphor comprises Eu-doped CaAlSiN$_3$.

5. The encapsulating package of claim 4, wherein the filter material has an absorption peak at a wavelength in the range 580-600 nm.

6. The encapsulating package of claim 5, wherein the encapsulating package device encapsulates the LED die to form an LED, and the filter material is present at a concentration, relative to the bulk encapsulating material, that yields
a color rendering index (CRI) of at least 80,
a lumens-per-watt (LPW) of at least 80, and
a mathematical-product of CRI times LPW that is greater than for any other possible concentration of the filter material in the bulk encapsulating material.

7. A light-transmissive encapsulating package configured to encapsulate an LED die, the encapsulating package comprising:
a light-transmissive bulk encapsulating material;
phosphors blended into the bulk encapsulating material for white light emission; and
a notch-filtering filter material that is blended into the bulk encapsulating material and comprises NdO$_x$Cl$_y$.zH$_2$O, in which x and y and z are positive real numbers and the Nd is in a third oxidation state.

8. The encapsulating package of claim 7, wherein the filter material is present at a concentration in the range 0.5-3.0% by volume of the bulk encapsulating material.

9. The encapsulating package of claim 8, wherein
the bulk encapsulating material is silicone,
the phosphors include:
a yellow-emitting phosphor comprising Ce-doped YAG present in the encapsulating material in the range 0.5% to 5% by volume of the encapsulating package, and
a red-emitting phosphor comprising Eu-doped CaAlSiN$_3$ present in the encapsulating material in the range 0.5% to 5% by volume of the encapsulating package.

10. The encapsulating package of claim 9, wherein the filter material has a main absorption peak in the range 580-600 nm.

11. The encapsulating package of claim 10, wherein the phosphors and the filter material are present in the form of particles having a size in the range 0.5 um to 100 um.

12. The encapsulating package of claim 11, wherein the filter material has a refractive index in the range 1.55-1.80.

13. The encapsulating package of claim 12, wherein:
the encapsulating package device encapsulates the LED die to form an LED; and
the filter material is present at a concentration, relative to the bulk encapsulating material, configured to yield:
a color rendering index (CRI) of light emitted by the LED of at least 80, and
a lumens-per-watt (LPW) of at least 80, wherein the LPW equals number of lumens emitted by the LED divided by the number of electrical watts consumed by the LED.

14. The encapsulating package of claim 13, wherein the filter material is present at a concentration, relative to the bulk encapsulating material, configured to yield a mathematical-product of CRI times LPW that is greater than for any other possible concentration of the filter material.

15. The encapsulating package of claim 2, wherein:
the encapsulating package device encapsulates the LED die to form an LED; and
the filter material is present at a concentration, relative to the bulk encapsulating material, configured to yield:
a color rendering index (CRI) of light emitted by the LED of at least 80,
a lumens-per-watt (LPW) of at least 80, wherein the LPW equals number of lumens emitted by the LED divided by the number of electrical watts consumed by the LED, and
a mathematical-product of CRI times LPW that is greater than for any other possible concentration of the filter material in the bulk encapsulating material.

16. The encapsulating package of claim 2, wherein:
the yellow-emitting phosphor comprises Ce-doped YAG, and
the red-emitting phosphor comprises Eu-doped CaAlSiN$_3$.

17. An LED module comprising:
an LED die; and
a light-transmissive encapsulating package that encapsulates the LED die and that comprises:
a light-transmissive bulk encapsulating material;
a yellow-emitting phosphor that:
is blended into the bulk encapsulating material,
is present in the range 0.5% to 5% by volume of the encapsulating package, and
is present in the form of particles having a size in the range 0.5 um to 100 um;
a red-emitting phosphor that:
is blended into the bulk encapsulating material,
is present in the range 0.5% to 5% by volume of the encapsulating package, and
is present in the form of particles having a size in the range 0.5 um to 100 um; and
a notch-filtering filter material that:
is blended into the bulk encapsulating material,
comprises NdO$_x$Cl$_y$.zH$_2$O in which x and y and z are non-zero positive real numbers,
has an absorption peak at a wavelength in the range 580-600 nm,
is present at a concentration in the range 0.5-3.0% by volume of bulk encapsulating package,
is present in the form of particles having a size in the range 0.5 um to 100 um,
has a refractive index in the range 1.55-1.80,
is present at a concentration configured to yield
a color rendering index (CRI) of light emitted by the LED of at least 80,
a lumens-per-watt (LPW) of at least 80, wherein the LPW equals the number of lumens emitted by the LED module divided by the number of electrical watts consumed by the LED module, and
a multiplication-product of the CRI times the LPW that is greater than for any other possible concentration of the filter material in the bulk encapsulating package.

18. The encapsulating package of claim 17, wherein:
the yellow-emitting phosphor comprises Ce-doped YAG, and
the red-emitting phosphor comprises Eu-doped CaAlSiN$_3$.

19. The encapsulating package of claim 7, wherein:
the filter material is NdClO.zH$_2$O.

* * * * *